(12) United States Patent
Poggi et al.

(10) Patent No.: US 6,522,196 B1
(45) Date of Patent: Feb. 18, 2003

(54) SYSTEM AND METHOD FOR IMPROVING INPUT RETURN LOSS IN RF AMPLIFIERS

(75) Inventors: Peter John Poggi, Webster, NY (US); George Cabrera, Mason, OH (US); Paul Moore, Cincinnati, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/931,734

(22) Filed: Aug. 20, 2001

(51) Int. Cl.[7] .............................................. H03F 3/60
(52) U.S. Cl. ..................................... 330/53; 330/124 R
(58) Field of Search ........................ 330/53, 54, 124 R, 330/286, 295, 124 D, 310, 311, 51; 333/117, 125

(56) References Cited

U.S. PATENT DOCUMENTS

| | | | | |
|---|---|---|---|---|
| 3,911,372 A | * | 10/1975 | Seidel | .................... 330/124 R |
| 4,079,325 A | * | 3/1978 | Mawhinney et al. | ........ 327/102 |
| 4,701,716 A | * | 10/1987 | Poole | .................... 330/124 R |
| 6,005,454 A | * | 12/1999 | Kim | ........................... 333/128 |
| 6,072,376 A | * | 6/2000 | Matsuyoshi et al. | .... 330/124 R |
| 6,297,696 B1 | * | 10/2001 | Abdollahian et al. | ... 330/124 R |

* cited by examiner

*Primary Examiner*—Terry D. Cunningham
*Assistant Examiner*—Long Nguyen
(74) *Attorney, Agent, or Firm*—Duane Morris LLP (57) ABSTRACT

A system and method for improving the input return loss in RF amplifiers is disclosed. One embodiment of the present invention amplifies only one of the two output quadrature signals of 3 dB coupler in an amplifier module while substantially maintaining a constant impedance at the input to the 3 dB coupler. This removes one of the design constraints for designing the input network for an amplifier module thereby allowing for more flexible amplifier designs and ease of cascading amplifier modules. One embodiment of the present invention improves the input return loss of an RF amplifier pallet in a cascaded-stage power amplifier circuit for a television transmitter including a 3 dB coupler by replacing one of the two amplifiers connected to the output of the 3 dB coupler with an electrical circuit of substantially equivalent impedance to the input impedance of the non-replaced amplifier.

22 Claims, 5 Drawing Sheets

SYSTEM AND METHOD FOR IMPROVING INPUT RETURN LOSS IN RF AMPLIFIERS

BACKGROUND OF THE INVENTION

The present invention relates to improving the input return loss in RF amplifiers. More specifically, the impedance of an amplifier module including a 3 dB coupler at the input is maintained substantially constant while removing one of the two amplifiers normally connected to the output terminals of a 3 dB coupler. A preferred embodiment replaces the removed amplifier with an electrical circuit with an impedance that is substantially equivalent to the input impedance of the non-removed amplifier. Another preferred embodiment uses the amplifier module including a 3 dB coupler with an electrical circuit in place of one of the amplifiers in a cascaded-stage power amplifier circuit for a television transmitter.

RF amplifier input network designs must typically satisfy a number of constraints: (a) maintain required operational performance, such linearity, gain flatness, and maintaining sufficient signal with a specified slope at the active device input terminal, (b) maintain operational stability over the design operating range while compensating for incidental effects, such as am to am and am to pm distortion, (c) satisfy overall physical constraints for the amplifier, such as size, shape, weight, and cost considerations, and (d) provide a match to some nominal system interface impedance, which is typically 50 ohms for an RF system. These design criteria are typically used in television transmitter amplifier networks.

The requirement to match the nominal system interface impedance with sufficient accuracy is typically the hardest to achieve. Matching the interface impedance becomes an even more daunting task for amplifier networks comprising cascaded stages. For such systems, it is very difficult to match the interface impedance of each stage while efficiently achieving, in terms of amplifier efficiency, size, shape, weight, and cost, the necessary amplification at each stage. Overall performance of the cascaded amplifier networks, when compared with the results expected from the sum of individual stage performances, degrades rapidly when interstage impedance is not maintained.

One prior art solution to the problem of maintaining interstage impedance is the use of a quadrature hybrid combined amplifier for each stage of a cascaded-stage amplifier system. Quadrature hybrid combined amplifiers are known in the art and are described in detail in Anaren's 1997 Product Catalog, pp. 60–73, Anaren Microwave, Inc., which is hereby incorporated herein by reference. These quadrature hybrid combined amplifiers are used in cascaded-stage power amplifier networks for television transmitters.

Figure 2:
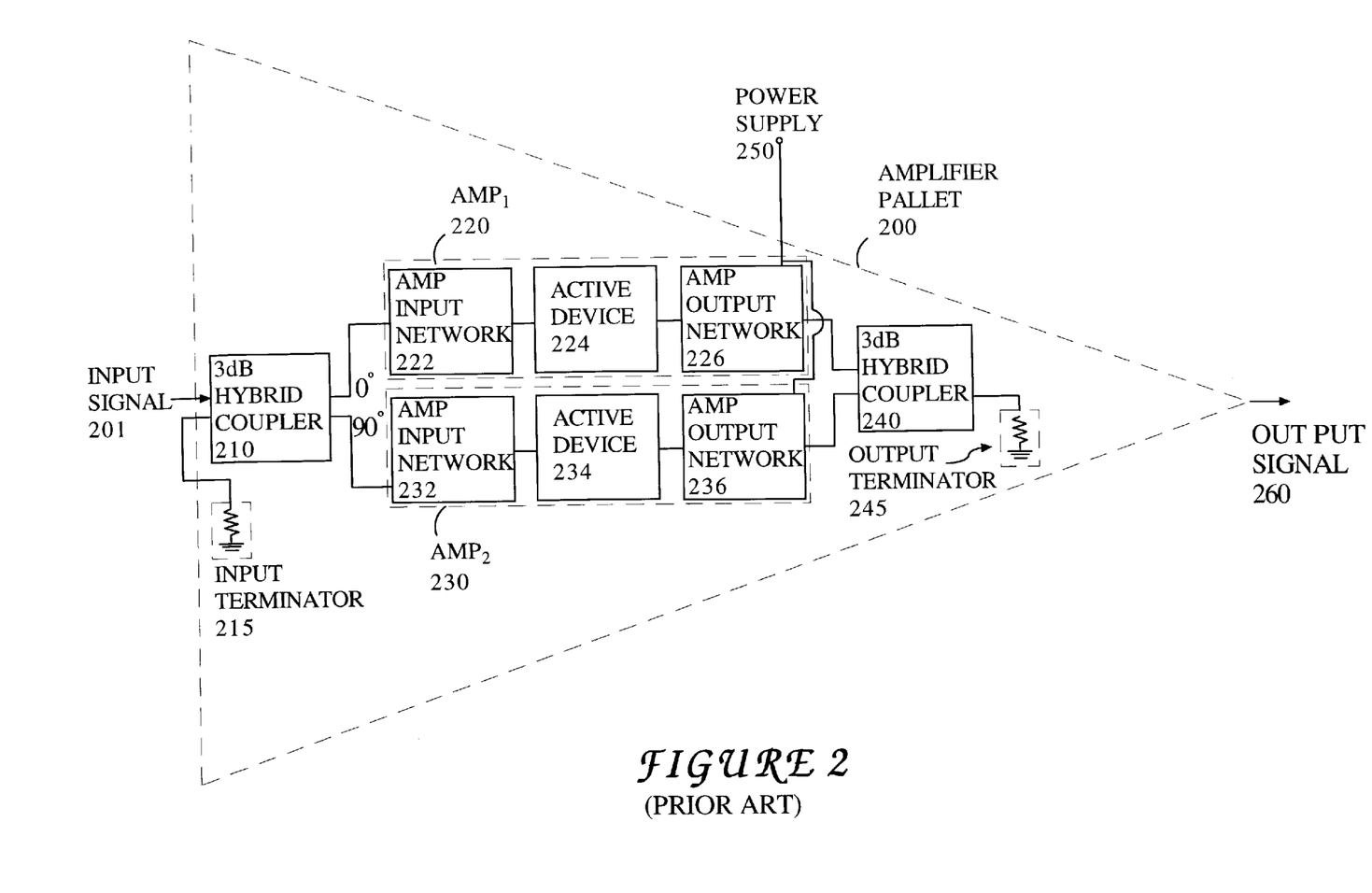
FIG. 2 is a circuit diagram in block form illustrating a prior art amplifier module ("pallet") with a first amplifier at the in-phase output terminal and a second amplifier at the quadrature output terminal.

An example of a prior art quadrature hybrid combined amplifier is shown diagrammatically in FIG. 2. The prior art quadrature hybrid combined amplifier 200, also referred to herein as an "amplifier pallet" or "pallet", comprises the 3 dB coupler 210 at the input of the device acting as a divider, an amplifier for each of the output terminals of the 3 dB coupler 210, and the 3 dB coupler 240 at the output of the pallet 200 acting as a combiner.

A typical 3 dB coupler, as is known in the art, may input a signal at one input terminal and produce, as a function of the input signal, an in-phase and a quadrature signal, relative to the input signal, each at a separate output terminal and each at approximately one-half of the power of the input signal. Generally, for example, when used at the input of the pallet 200, the input 3 dB coupler 210 receives the input signal 201 on one input terminal while the other input terminal is terminated by the input terminator 215. The 3 dB coupler 210 produces an in-phase signal and a quadrature signal, which are sent to the amplifier circuits 220 and 230, respectively. The amplifier circuits 220 and 230 produce an amplified version of the in-phase and quadrature signals, respectively, which are combined in the output 3 dB coupler 240. The output 3 dB coupler 240 produces an amplified, recombined input signal on one output terminal while hi the other output terminal is terminated. While this description provides a general idea of the signal flow paths through the pallet 200 in FIG. 2, a more complete description of FIG. 2 will be provided below.

3 dB hybrids have the desirable property of high input return loss at the common driven input port, provided the load impedances at the in-phase and quadrature output terminals are identical. Taking the example of the input 3 dB coupler 210 of FIG. 2, the impedance of the amplifiers 220 and 230 at the in-phase and quadrature output ports, respectively, is typically different than the nominal system impedance. However, as long as the impedance of each of the amplifiers is identical, essentially all of the energy reflected by the amplifiers at the in-phase and quadrature output ports of the input 3 dB coupler is absorbed at the terminated port of the 3 dB coupler 210. This results in nominal system impedance at the non-terminated input port of the 3 dB coupler. Return losses of better than 20 dB are typically achieved over the two to one and greater bandwidths of commercially available 3 dB hybrids.

While placing two amplifiers of identical impedance at the in-phase and quadrature output ports of the input 3 dB coupler of an amplifier stage effectively matches the impedance of the stage with the nominal system impedance, such a solution may be inefficient in terms of the stage's cost, complexity, size, and overall efficiency if the amplification capacity with two amplifiers is more than is needed. In a cascaded-stage amplifier network, the amplification capacity of two amplifiers are not always needed in every stage and there is not an infinite gradation of available active to semiconductor devices at a corresponding cost gradation to allow a convenient scaling of the two amplifier approach to any required design capacity. In that regard, the elimination of one of the two amplifiers can supply the appropriate scaling to match the required design capacity. Typically, some of the amplifier modules in the initial stages of a cascaded-stage amplifier network, such as a driver stage, do not need the two amplifier capacity. Using an amplifier module with two amplifiers in the driver stage may not be cost effective, may render the driver stage too large physically to fit into a desired space, and may underutilize the amplification capacity available thereby reducing the overall efficiency of the cascaded-stage amplifier network while unnecessarily increasing the complexity of the system.

The present invention solves the above-mentioned drawbacks of the prior art by replacing one of the amplifiers at either the in-phase or quadrature output port of the input 3 dB coupler with an electrical circuit ("dummy network") that emulates the input impedance of the non-replaced amplifier. A preferred embodiment matches the impedance of the dummy network with the input of the input network of the non-replaced amplifier, thereby maintaining the impedance balance between the in-phase and quadrature output ports of the 3 dB coupler. Another preferred embodiment uses the above-described matching dummy network configuration for television transmitters that may be used to transmit COFDM and/or 8VSB signals that may be in the 470 MHz to 860 MHz frequency range.

The dummy network that replaces one of the amplifiers may be the same as, or similar to, the input network of the non-replaced amplifier and may comprise a simple reactive network with a resistive/reactive termination to simulate the amplifier's active device load. The dummy network may replace either the amplifier at the in-phase output terminal or the amplifier at the quadrature output terminal. So long as the impedance of the dummy network substantially matches the input impedance of the non-replaced amplifier, the input impedance of the 3 dB coupler, and therefore the impedance of the amplifier stage, will remain at the nominal interstage impedance. Typical interstage impedance values for cascaded-stage amplifier networks in television transmitters is 50 ohms but it is to be understood that the effectiveness of the present invention is not limited to systems with 50 ohm impedance. The present invention is also effective in systems where the nominal interstage impedance is 75 ohms, such as for a CATV (cable television) system, and 300 ohms (balanced) such as for television receiver antenna circuits. It is to be understood that the above examples are not limiting and that the applicability of the present invention is not limited to any particular interstage impedance value.

The prior art amplifier circuit design method required that the circuit designer faced with the task of designing a circuit or an amplifier stage with only a single amplifier, had to design the amplifier with the capacity to amplify the input signal the desired amount as well as design an input network for that amplifier that satisfied all of the multiple criteria mentioned above: flat signal gain with frequency, stability, low am to am and am to pm distortion, and good input impedance relative to the nominal system impedance. By far the most difficult criteria to achieve is matching the input impedance with the nominal system impedance.

The present invention allows for the power amplifier circuit designer to design an amplifier stage with a single amplifier without having to worry that the impedance of the stage will not match the nominal system impedance. The use of a 3 dB coupler with a dummy network attached to either the in-phase or quadrature output terminal where the impedance of the dummy network substantially matches the impedance of the single amplifier greatly relieves the design burden of the amplifier circuit. It is much easier to design an amplifier input network that satisfies all of the design constraints but the constraint of matching nominal system impedance and a dummy network to mimic the input impedance of that amplifier than it is to design a single amplifier with an input network that satisfies all of the design constraints.

While the present invention sacrifices the amplification capacity of the replaced amplifier by replacing the amplifier with a dummy network, the amplification capacity that is lost is typically underutilized. Therefore, the overall performance of the cascaded-stage amplifier network does not suffer. The present invention also sacrifices 3 dB of gain compared to prior art systems with two amplifiers. However, the loss of 3 dB of gain is not a detriment to the operation of the cascaded-stage amplifier network provided that the overall design gain requirements of the network are met.

Accordingly, it is an object of the present invention to obviate many of the above problems in the prior art and to provide a novel system and method for improving the input return loss in RF amplifiers.

It is another object of the present invention to provide a novel system and method for amplifying only one of the two output quadrature components of an input signal to a 3 dB coupler in an amplifier module while substantially maintaining a constant input impedance for the 3 dB coupler.

It is yet another object of the present invention to provide a novel system and method for improving the input return loss of an RF amplifier pallet including a 3 dB coupler by replacing one of the two amplifiers connected to the output of the 3 dB coupler with an electrical circuit of substantially equivalent impedance to the input impedance of the non-replaced amplifier.

It is still another object of the present invention to provide a novel system and method of operating a hybrid combined amplifier module comprising a 3 dB coupler by replacing one of the two amplifiers connected to the output of the 3 dB coupler with an electrical circuit of substantially equivalent impedance to the input impedance of the non-replaced amplifier.

It is a further object of the present invention to provide a novel system and method for amplifying either a COFDM or an 8VSB signal in the 470 MHz to 860 MHz range in a cascaded-stage power amplifier where each stage includes a 3 dB coupler by replacing one of the two amplifiers connected to the output of the 3 dB coupler with an electrical circuit of substantially equivalent impedance to the input impedance of the non-replaced amplifier.

It is yet a further object of the present invention to provide a novel system and method for improving the input return loss of an RF amplifier pallet in a cascaded-stage power amplifier circuit for a television transmitter including a 3 dB coupler by replacing one of the two amplifiers connected to the output of the 3 dB coupler with an electrical circuit of substantially equivalent impedance to the input network of the non-replaced amplifier.

It is still a further object of the present invention to provide a novel system and method for maintaining, at a predetermined value, the impedance of an amplifier module comprising a 3 dB hybrid coupler with two output terminals each passing one of the two quadrature output signals to a separate amplifier, by replacing one of the amplifiers with electrical circuit with an impedance that substantially matches the input impedance of the non-replaced amplifier.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

With reference to the drawings, like numerals represent like components throughout the several drawings.

Figure 1:
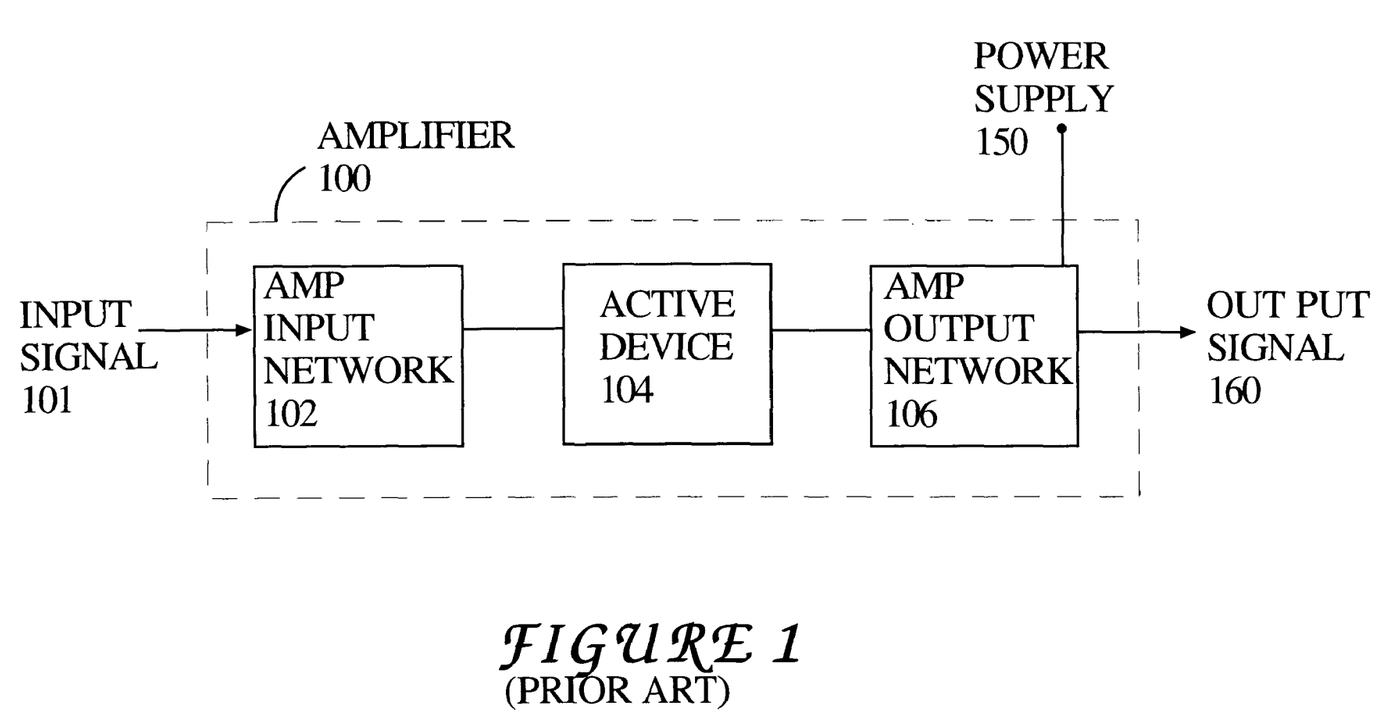
FIG. 1 is a circuit diagram in block form illustrating a prior art amplifier circuit with a single amplifier.

FIG. 1 is a circuit diagram in block form illustrating a prior art amplifier circuit 100 comprising a single amplifier. The input signal 101 is received by the amplifier input network 102, is passed to the active device 104 and then to the amplifier output network 106. The amplifier 100 is powered by the power supply 150. The output signal 160 is output from the amplifier output network. If a designer were to try to design the amplifier circuit 100 to be used in a cascaded-stage amplifier network, the designer would be faced with the difficult task designing the input network 102 to satisfy a number of constraints: (a) maintain required operational performance, such linearity, gain flatness, and maintaining sufficient signal with a specified slope at the active device input terminal, (b) maintain operational stability over the design operating range while compensating for incidental effects, such as am to am and am to pm distortion, (c) satisfy overall physical constraints for the amplifier, such as size, shape, weight, and cost considerations, and (d) provide a match to some nominal system interface impedance, which is typically 50 ohms for RF systems. As discussed above, the most difficult criteria to meet is matching the input impedance of the amplifier circuit 100 with the system impedance. For a single amplifier circuit such as that shown in FIG. 1, much time and care must be taken by the designer to ensure that the design of the amplifier input network 102 meets the impedance criteria while maintaining the other three criteria within acceptable limits.

With reference now to FIG. 2, one prior art solution to the impedance matching problem is shown. The amplifier pallet 200 comprises the two amplifiers 220 and 230 and two 3 dB hybrid couplers, the 3 dB coupler 210 at the input of the pallet 200 and the 3 dB coupler 240 at the output of the pallet 200. The 3 dB coupler 210 receives the input signal 201 via a first input terminal. A second input terminal is connected to the terminator 215. The terminator is typically a resistor of nominal system impedance, which may be 50 ohms to match the nominal system impedance of an RF system, which is typically 50 ohms. The 3 dB coupler 210 derives an in-phase signal and a quadrature signal from the input signal 201. The in-phase signal and the quadrature signal are output from the 3 dB coupler via separate terminals. As shown in FIG. 2, the in-phase signal (denoted by 0° in the FIGS.) and the quadrature signal (denoted by 90° in the FIGS.) in the amplifier pallet 200 are sent to the amplifier circuit 220 and the amplifier circuit 230, respectively. The power supply 250 supplies the necessary power for the amplifier circuits 220 and 230. The output of the amplifier circuits 220 and 230 are combined in the 3 dB coupler 240 and the output signal 260 is output via a first output terminal of the 3 dB coupler 240, and hence is output from the pallet 200. A second output terminal from the 3 dB coupler 240 is connected to the terminator 245, which may be a resistive 20 load of nominal system impedance, which may be 50 ohms to match the nominal system impedance of an RF system, which is typically 50 ohms.

With continued reference to FIG. 2, each of the amplifier circuits 220 and 230 may contain an input network 222 and 232, respectively, an active device 224 and 234, respectively, and an output network 226 and 236, respectively. While the overall configuration of the amplifier circuits 220 and 230 may be the same as the amplifier circuit 100 of FIG. 1, the design of the amplifier circuits 220 and 230 is simpler due to the presence of the 3 dB couplers in the pallet 200. As discussed above, the 3 dB couplers have the desirable property of high input return loss. The impedance of the amplifiers 220 and 230 at the in-phase and quadrature output ports, respectively, is typically different than the nominal system impedance. However, so long as the impedance of each of the amplifiers is identical, essentially all of the energy reflected by the amplifiers at the in-phase and quadrature output ports of the input 3 dB coupler is absorbed at the terminated input port of the coupler. This results in nominal system impedance at the non-terminated input port of the 3 dB coupler, which is typically 50 ohms for an RF system, but may be, for example, 75 ohms for a CATV (cable television) system, and 300 ohms (balanced) for television receiver antenna circuits.

Since the 3 dB coupler acts to isolate the impedance of the amplifier circuits 220 and 230, the designer is faced with the much easier task of designing the input network 222 and the input network 232 of the amplifier circuits 220 and 230, respectively, without regard to the nominal system impedance, so long as the input impedance of amplifier circuit 220 is substantially identical to the input impedance of the amplifier circuit 230. If the input impedances of the amplifier circuits 220 and 230 are substantially similar, the 3 dB coupler will substantially maintain the nominal system impedance thereby relieving the designer of the burden of meeting an impedance criteria.

While the prior art solution is practical, it is not always a very efficient solution. In the case of a cascaded-stage amplifier network, the driving amplifiers may not require the amplification capacity of two amplifiers. Therefore, the cost, size, cooling requirements, and excess amplification capacity of the second amplifier in the pallet 200 may not be an attractive solution. However, the use of a single amplifier circuit 100 may present too many design problems and may also be an unattractive option. Up until now, the prior art was limited to one of the two above solutions.

Figure 3A:
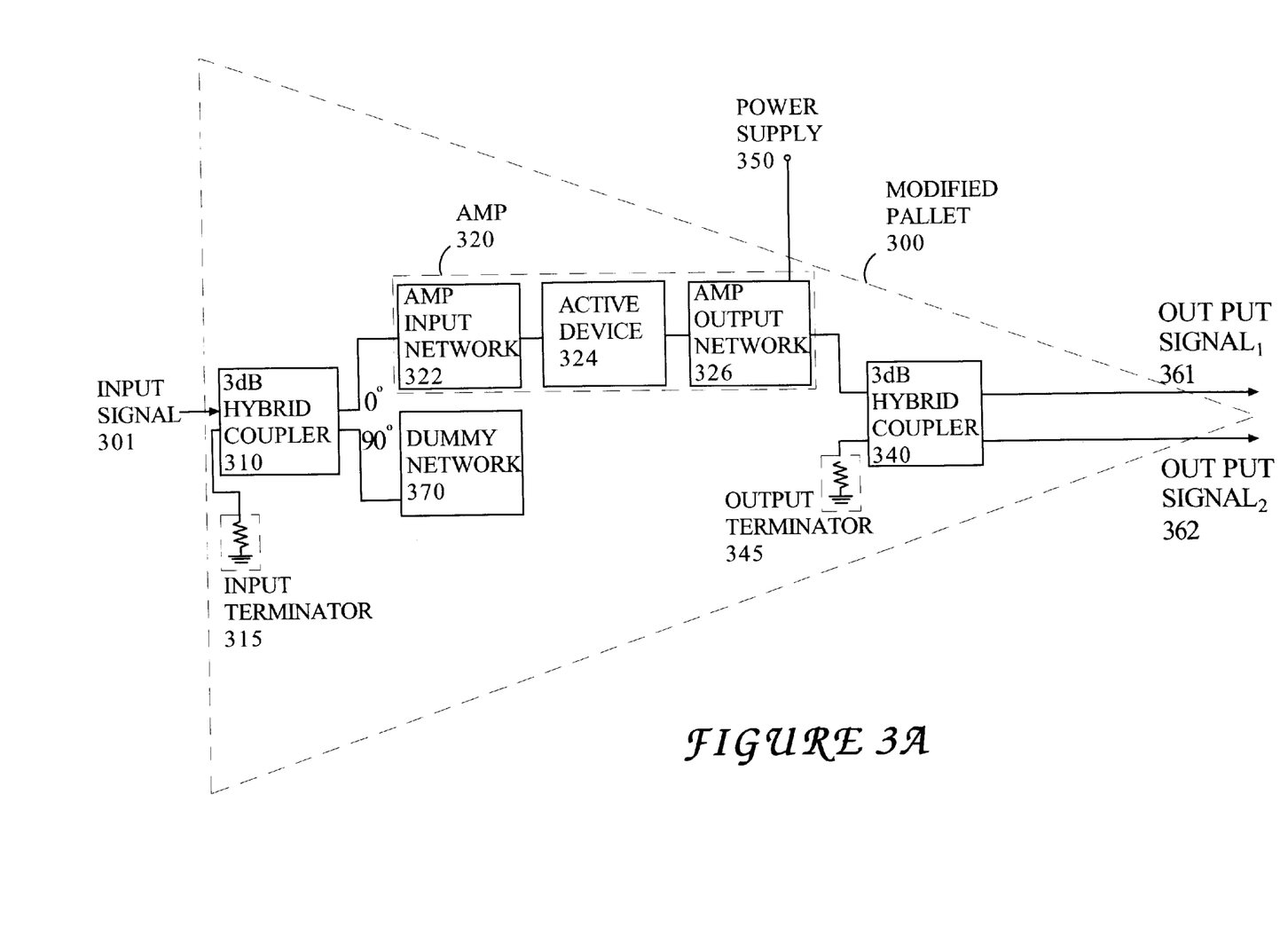
FIG. 3A is a circuit diagram in block form illustrating a modified amplifier module ("modified pallet") with an amplifier at the in-phase output terminal and a dummy network at the quadrature output terminal.
Figure 3B:
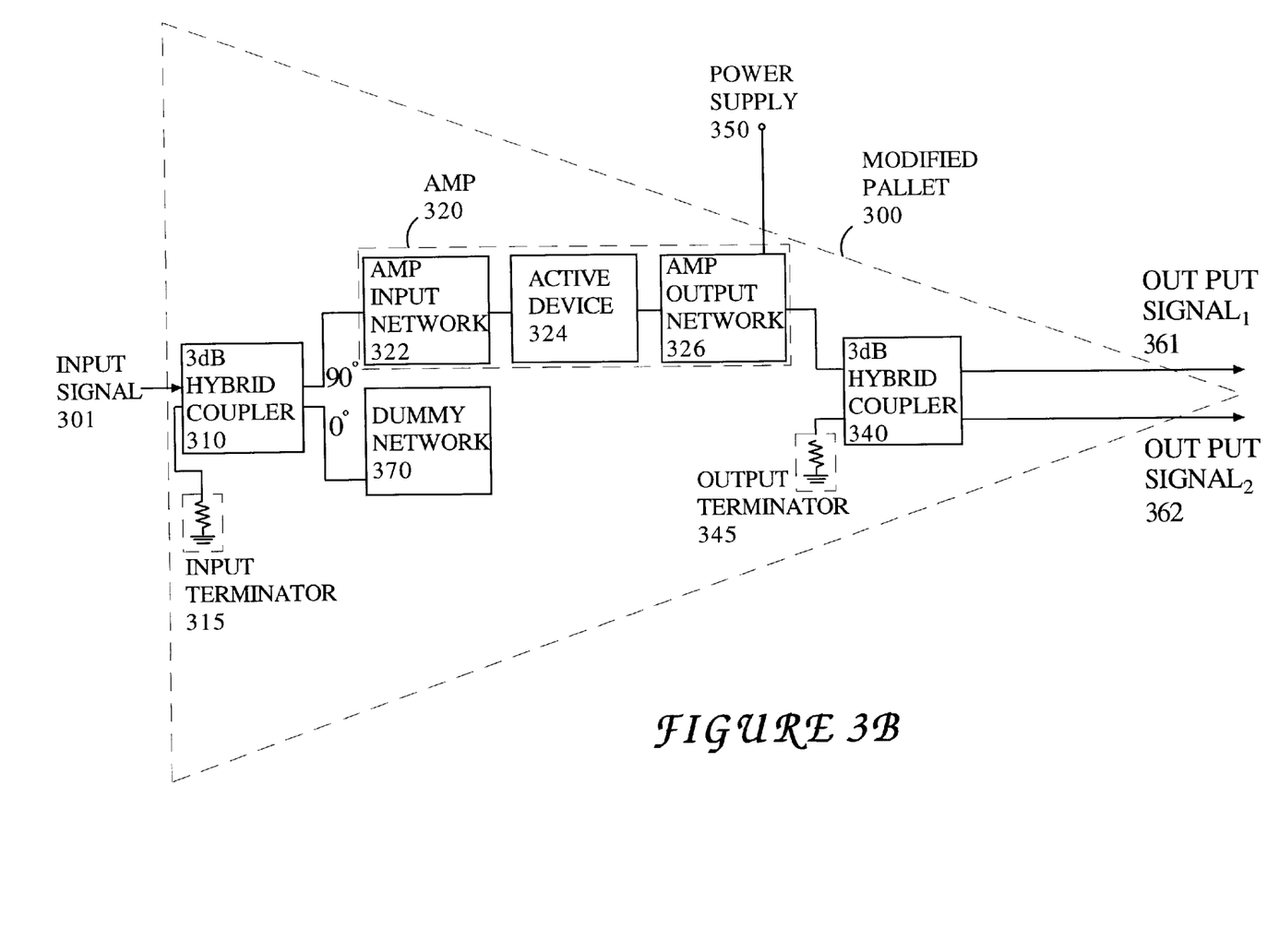
FIG. 3B is a circuit diagram in block form illustrating a modified amplifier module ("modified pallet") with an amplifier at the quadrature output terminal and a dummy network at the in-phase output terminal.

With reference now to FIGS. 3A and 3B, a modified pallet 300 is shown, where components in FIGS. 3A and 3B represent like components in FIG. 2 where the last two digits in the identification numbers are the same.

The modified pallet 300 comprises dummy network 370, which replaces an amplifier circuit similar to the amplifier circuit 230 in the pallet 200 in FIG. 2. The dummy network 370 is designed so as to have an input impedance identical to, or at least substantially similar to, the input impedance of the amplifier circuit 320. The dummy network 370 may be comprised of components that are identical to or substantially similar to the components of the amplifier input network 322. By substantially matching the impedance of the dummy network 370 to the input impedance of the amplifier circuit 320, the 3 dB coupler 310 is able to substantially match the nominal system impedance at its input terminal. Furthermore, the modified pallet 300 eliminates the excess cost, size, cooling requirements, and amplification capacity of a second amplifier circuit. Therefore, the modified pallet 300 relieves the designer of the burden of meeting the impedance criteria while designing the amplifier as well as resulting in a more efficient design by only using one amplifier circuit in the modified pallet.

FIG. 3A shows the amplifier circuit 320 connected to the in-phase component terminal of the 3 dB coupler 310 and the dummy network 370 is connected to the quadrature terminal of the 3 dB coupler 310. It is to be understood that the present invention contemplates that the terminals to which the amplifier circuit 320 and the dummy network 370 are connected can be switched. The amplifier circuit 320 may be connected to the quadrature terminal and the dummy network 370 may be connected to the in-phase terminal of the 3 dB coupler 310 as shown in FIG. 3B.

The modified pallet 300 only amplifies one of the two components of the input signal 301, while the pallet 200 amplifies both of the components of the input signal 201. The loss of one of the components of the input signal 301 in the modified pallet 300, and the concomitant loss in signal power, is a relatively minor drawback of the cascaded-stage amplifier network, as discussed above.

The 3 dB coupler 340 has only one input signal from the amplifier circuit 320 and therefore differs from the 3 dB coupler 240 in FIG. 2, which has two input signals, one from each of the amplifier circuits 220 and 230. The 3 dB coupler 340 has the terminator 345 connected to the second input terminal and outputs the output signal 361, which may be the in-phase component of the input signal to the 3 dB coupler 340, and the output signal 362, which may be the quadrature component of the input signal to the 3 dB coupler 340.

It should be noted that the pallet 200 is capable of receiving one input signal and delivering one output signal. The modified pallet 300 is capable of receiving one input signal and delivering two output signals and therefore may be useful in a cascaded-stage amplifier network that fans-out, i.e., has more parallel amplification paths in a given stage than in a previous stage, without the need of a divider circuit.

In a preferred embodiment of the present invention, the modified pallet in FIG. 3 may also be configured and operated without the 3 dB coupler 340 and the output terminator 345. In such a configuration, the modified pallet 300 would produce only one output signal rather than the two output signals shown in FIG. 3. Otherwise, the configuration and operation of the modified pallet 300 would be the same as shown in FIG. 3 and as described above.

Figure 4:
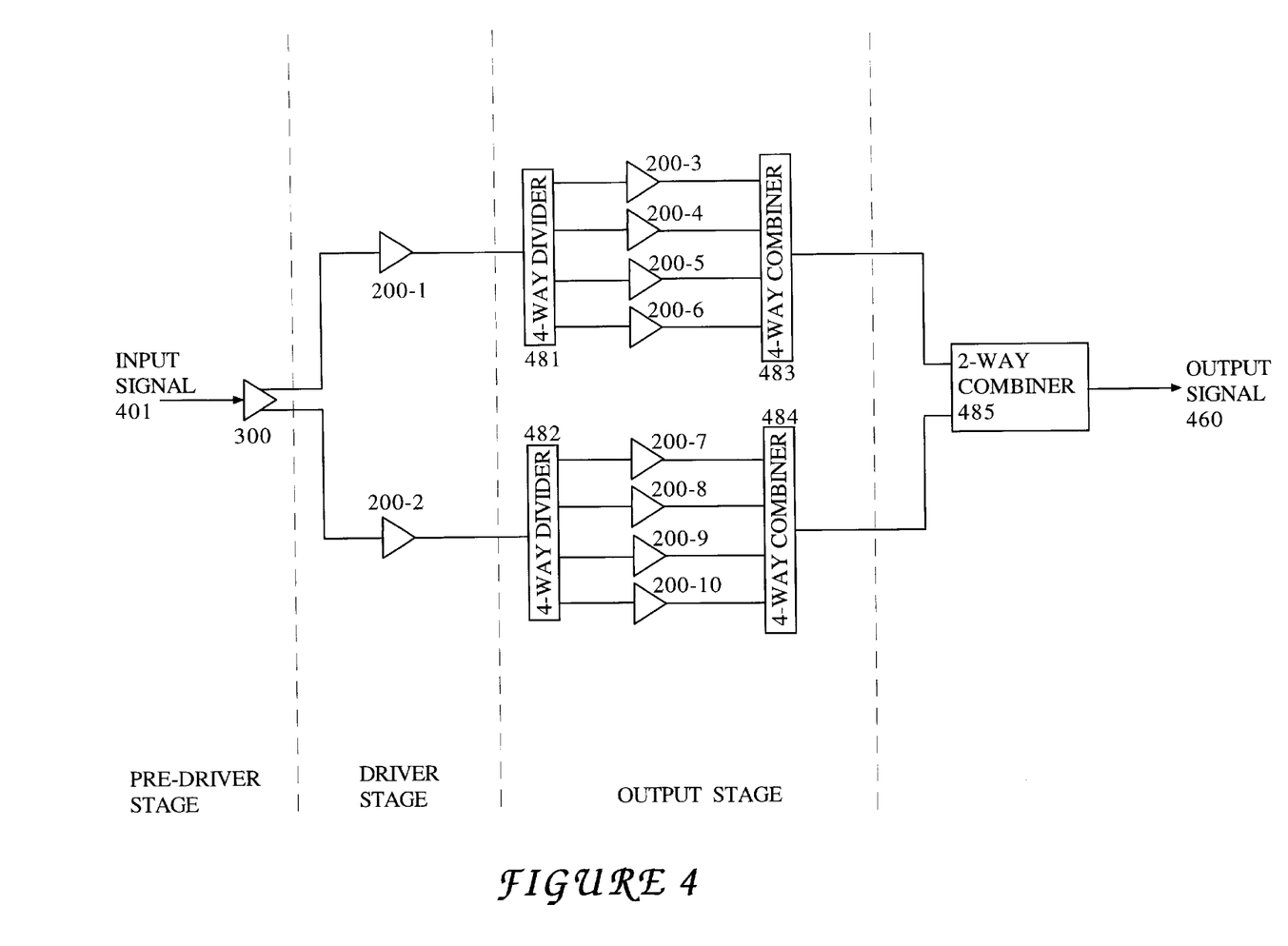
FIG. 4 is a circuit diagram in block form illustrating a three-stage cascaded network of amplifiers with a modified pallet in the pre-driver stage and pallets in the driver in output stages.

With reference now to FIG. 4, where like numerals represent like components with FIGS. 2 and 3A and 3B, a cascaded-stage amplifier network is depicted in block form with three stages: a pre-driver stage, a driver stage, and an output stage. It is to be understood that FIG. 4 is merely a depiction of one embodiment of the invention and that the invention should not be limited to this particular configuration of amplifiers or to the number of amplifiers and/or dividers and combiners shown.

According to one embodiment of the present invention, the pre-driver stage is comprised of one modified pallet 300, as described above, receiving an input signal 401. Each of the two outputs from the modified pallet 300 are received by one of the pallets 200-1 and 200-2, each similar to pallet 200 described above. The output of each of the pallets 200-1 and 200-2 are directed to a 4-way divider, 481 and 482, respectively. The outputs of divider 481 are directed to pallets 200-3 through 200-6 and the output of divider 482 are directed to pallets 200-7 through 200-10, all in the output stage shown in FIG. 4. The outputs of pallets 200-3 through 200-6 are combined in the 4-way combiner 483. Similarly, the outputs of pallets 200-7 through 200-10 are combined in the 4-way combiner 484. The outputs of the 4-way combiners 483 and 484 are combined in the 2-way combiner 485, which outputs the output signal 460.

The 4-way dividers 481 and 482, the 4-way combiners 483 and 484, and the 2-way combiner 485 may be typical divider or combiner components known in the art.

In operation, the input signal 401 enters the modified pallet 300 in the pre-driver stage, is amplified and sent to the pallets 200-1 and 200-2 in the driver stage, where additional amplification is added. Similarly, the pallets in the output stage each amplify a portion of the signal entering the 4-way dividers 481 and 482. The 4-way combiners 483 and 484 and the 2-way combiner 485 combine the outputs of the pallets 200-3 through 200-10 to form the output signal 460, which is function of the input signal 401. The above-described cascaded-stage amplifier network may be used, e.g., in a television transmitter. Other uses of the amplifier network shown in FIG. 4 would include, but would not be limited to, a cellular base station power amplifier.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A modified hybrid combined amplifier module comprising:
    a 3 dB hybrid coupler comprising:
        a first input terminal for receiving an input signal;
        a second input terminal connected to a terminating load;
        a first output terminal for passing the in-phase component of said input signal; and
        a second output terminal for passing the quadrature component of said input signal;
    a power amplifier circuit operatively connected to a one of said two output terminals; and
    a non amplifying electrical network operatively connected to the other of said two output terminals whereby the impedance of said electrical network substantially matches the impedance of said power amplifier circuit;
    whereby said power amplifier amplifies the component of the input signal passed by said one output terminal.

2. The amplifier module of claim 1 wherein said electrical network is operatively connected to said output terminal passing said in-phase signal component and said power amplifier circuit is operatively connected to said output terminal passing said quadrature signal component.

3. The amplifier module of claim 1 wherein said power amplifier circuit is operatively connected to said output terminal passing said in-phase signal component and said electrical network is operatively connected to said output terminal passing said quadrature signal component.

4. The amplifier module of claim 1 wherein said power amplifier circuit includes an input network and wherein the impedance of said electrical network substantially matches the impedance of said input network of said power amplifier circuit.

5. The amplifier module of claim 1 wherein said input signal is a COFDM or an 8VSB signal.

6. The amplifier module of claim 1 wherein said terminating load is 50 ohms.

7. The amplifier module of claim 1 wherein the frequency of said input signal is in the range of 470 MHz to 860 MHz.

8. A method for operating a hybrid combined amplifier module comprising a 3 dB hybrid coupler comprising a first input terminal and two output terminals whereby an amplifier circuit is operatively connected to one of said two output terminals, comprising the steps of:
    (a) receiving an input signal at said input terminal;
    (b) passing the quadrature component of said input signal out one of said two output terminals and into a non-amplifying electrical network that substantially matches the impedance of said amplifier circuit;

(c) passing the in-phase component of said input signal out the other of said two output terminals and into said amplifier circuit; and (d) amplifying said in-phase component with said amplifier circuit to thereby provide an amplified signal responsive to said in-phase component.

9. The method of claim 8 including the additional steps of:

(d) passing said amplified signal to an input terminal of a second 3 dB hybrid coupler;

(e) passing the in-phase component of said amplified signal out one of two output terminals of said second 3 dB coupler; and (f) passing the quadrature component of said amplified signal out the other of said two output terminals of said second 3 dB coupler.

10. The method of claim 8 wherein said in-phase component of said input signal is passed into said electrical network and said quadrature component of said input signal is passed into said amplifier circuit.

11. The method of claim 8 wherein said amplifier circuit includes an input network and wherein the impedance of said electrical network substantially matches the impedance of said input network of said amplifier circuit.

12. The method of claim 8 wherein said input signal is a COFDM or an 8VSB signal.

13. The method of claim 8 wherein the frequency of said input signal is in the range of 470 MHz to 860 MHz.

14. In a cascaded-stage power amplifier circuit for a television transmitter comprising a plurality of amplifier stages wherein each stage comprises one or more amplifier pallets and wherein each amplifier pallet comprises:

a 3 dB hybrid coupler for receiving an input signal comprising:
  a first output terminal for passing the in-phase component of said input signal; and
  a second output terminal for passing the quadrature component of said input signal;

a first power amplifier including a first input network operatively connected to said first output terminal; and a second power amplifier including a second input network operatively connected to said second output terminal;

the improvement comprising replacing, in at least one of said amplifier pallets, one of the said two power amplifiers with a non-amplifying electrical network that substantially matches the impedance of the replaced amplifier.

15. The cascaded-stage power amplifier circuit of claim 14 wherein the impedance of aid first power amplifier substantially matches the impedance of said second power amplifier.

16. The cascaded-stage power amplifier circuit of claim 14 wherein the impedance of aid electrical network substantially matches the impedance of the input network of the non-replaced power amplifier.

17. The cascaded-stage power amplifier circuit of claim 14 wherein said plurality of amplifier stages includes a pre-driver stage, a driver stage, and an output stage.

18. The cascaded-stage power amplifier circuit of claim 17 wherein said pre-driver stage includes at least one amplifier pallet and said driver stage includes at least two amplifier pallets.

19. The cascaded-stage power amplifier circuit of claim 18 wherein said output stage includes at least eight amplifier pallets.

20. A method for maintaining, at a predetermined value, the impedance of an amplifier module comprising a 3 dB hybrid coupler comprising:

a first input terminal for receiving an input signal;

a second input terminal connected to a terminating load;

a first output terminal for passing the in-phase component of said input signal; and a second output terminal for passing the quadrature component of said input signal;

comprising the steps of:
  (a) applying said input signal to said first input terminal;
  (b) connecting an amplifier to either of said first or said second output terminal; and
  (c) connecting a non-amplifying electrical device to the other output terminal;

where the impedance of said amplifier is substantially identical to the impedance of said electrical device thereby maintaining the impedance of the amplifier module at said predetermined value.

21. The method of claim 20 wherein said predetermined value is 50 ohms.

22. The method of claim 21 wherein said terminating load is 50 ohms.

* * * * *